(12) United States Patent
Wang et al.

(10) Patent No.: US 9,031,105 B2
(45) Date of Patent: May 12, 2015

(54) CONDUCTION COOLED HIGH POWER SEMICONDUCTOR LASER AND METHOD FOR FABRICATING THE SAME

(71) Applicant: Xi'an Focuslight Technologies Co., Ltd., Xi'an (CN)

(72) Inventors: Jingwei Wang, Xi'an (CN); Xingsheng Liu, Xi'an (CN)

(73) Assignee: Xi'an Focuslight Technologies, Co., Ltd., Xi'an (CN)

( * ) Notice: Subject to any disclaimer, the term of this patent is extended or adjusted under 35 U.S.C. 154(b) by 0 days.

(21) Appl. No.: 14/367,372

(22) PCT Filed: Nov. 22, 2012

(86) PCT No.: PCT/CN2012/085031
§ 371 (c)(1),
(2) Date: Jun. 20, 2014

(87) PCT Pub. No.: WO2013/091459
PCT Pub. Date: Jun. 27, 2013

(65) Prior Publication Data
US 2015/0030044 A1    Jan. 29, 2015

(30) Foreign Application Priority Data

Dec. 20, 2011  (CN) .......................... 2011 1 0453400

(51) Int. Cl.
*H01S 3/04* (2006.01)
*H01S 5/024* (2006.01)
*H01S 5/022* (2006.01)
*H01S 5/42* (2006.01)
*H01S 5/40* (2006.01)

(52) U.S. Cl.
CPC ............. *H01S 5/02407* (2013.01); *H01S 5/024* (2013.01); *H01S 5/42* (2013.01); *H01S 5/405* (2013.01);

(Continued)

(58) Field of Classification Search
CPC ............ H01S 5/02407; H01S 5/02469; H01S 5/4025; H01S 5/405; H01S 5/024; H01S 5/42
USPC ........................... 372/34, 35, 36, 50.12, 50.1
See application file for complete search history.

(56) References Cited

U.S. PATENT DOCUMENTS 5,099,488 A * 3/1992 Ahrabi et al. .................. 372/36
6,387,286 B1 * 5/2002 Takigawa et al. ............... 216/41
(Continued)

FOREIGN PATENT DOCUMENTS

CN    201927886 U    8/2011
CN    102255236 A    11/2011
(Continued)

OTHER PUBLICATIONS

ISA/CN, International Search Report for Intl Appln No. PCT/CN2012/085031, Feb. 28, 2013.

Primary Examiner — Kinam Park
(74) Attorney, Agent, or Firm — Fish & Tsang, LLP

(57) ABSTRACT

A conduction cooled high power semiconductor laser and a method for fabricating the same are provided. The conduction cooled high power semiconductor laser comprises a heat sink (2) and one or more semiconductor laser units (1). The semiconductor laser unit consists of a laser chip (3), a substrate (4) bonded to the laser chip for heat dissipation and electrical connection, and an insulation plate (5) soldered to the substrate for insulation and heat dissipation. The semiconductor laser unit is soldered on the heat sink with the insulation plate therebetween. The semiconductor laser unit may be tested, aged, and screened in advance, and thereby the yield of the lasers can be improved and the manufacturing costs can be reduced. The laser has desirable heat dissipation performance, high reliability, and is applicable to high temperature and other complex and volatile environments.

9 Claims, 3 Drawing Sheets

(52) U.S. Cl.
CPC ......... *H01S 5/02272* (2013.01); *H01S 5/02469* (2013.01); *H01S 5/4018* (2013.01); *H01S 5/4025* (2013.01)

(56) References Cited

U.S. PATENT DOCUMENTS 6,396,857 B1 * 5/2002 Labranche et al. ............. 372/36
2005/0069266 A1 * 3/2005 Kouta et al. ...................... 385/92
2005/0141574 A1 * 6/2005 Sakano et al. ................... 372/34
2009/0190218 A1 * 7/2009 Govorkov et al. ............. 359/495

FOREIGN PATENT DOCUMENTS

| CN | 102570291 A | 7/2012 |
| CN | 202503191 U | 10/2012 |

* cited by examiner

CONDUCTION COOLED HIGH POWER SEMICONDUCTOR LASER AND METHOD FOR FABRICATING THE SAME

TECHNICAL FIELD

The present invention relates to a semiconductor laser, and particularly, to a conduction cooled high power semiconductor laser and a method for fabricating the same, which belongs to the technical field of laser.

BACKGROUND ART

Semiconductor laser is also referred as diode laser (DL). High power semiconductor laser not only has the advantages of compact size, low weight, high electro-optical conversion efficiency, high reliability and longer working lifetime, but also presents a wider applications in the fields of pumping of solid state laser or fiber laser systems for industrial materials processing, laser communication, medical, scientific research, military and laser entertainment display etc., as it is driven by electric power and convenient to be used in various platforms. It is required in many applications that the semiconductor laser has the features of longer lifetime, high stability, high reliability and long storage time. Therefore, it brings great challenges to the semiconductor laser itself and the packaging technology on how to ensure the semiconductor laser to keep high working efficiency during the long-term operation.

By adopting conduction cooled methods and hard solder packaging technology, electromigration and electro-thermal migration caused by soft solder (indium) packaging process and failure caused by electromigration and electro-thermal migration can be avoided, and it can also meet the requirements for long storage time and stable work under extremely harsh environments. Therefore, conduction cooled semiconductor laser products are demanded widely to be used in various fields, e.g. aerospace, free space communication, laser machining, pumping solid/optical fiber laser.

FIG. 1 is the flow chart of fabricating conduction cooled semiconductor laser stacks, wherein a plurality of laser bars are simultaneously bonded together with a plurality of copper tungsten to form bars module, and then the unit is further soldered onto an insulated plate which has the ability of high heat dissipation. After that the module is soldered to a heat sink. There are following disadvantages existing in such a structure:

1. The yield is low. When bonding a plurality of chips together with a plurality of copper tungsten simultaneously to form bars module, the product will be unable to be used if one of the chips is damaged or failed, which leads to a quite low yield.

2. The heat dissipation property and the reliability are poor. When a plurality of bonded chips together with a plurality of copper tungsten are soldered to the insulated plate, copper tungsten in the middle of bars module is difficult to be soldered to the insulated plate due to the complicated process, which leads to the poor heat dissipation and low reliability of such product.

SUMMARY OF THE INVENTION

The present application seeks to overcome above disadvantages in the prior art and provides a conduction cooled high power semiconductor laser and a method for fabricating the same so as to address the problems in conduction cooled high power semiconductor laser, such as the low yield, the poor heat dissipation, and the low reliability etc.

The object of the present application is achieved by the following technical solutions:

A conduction cooled high power semiconductor laser, comprises a heat sink and one or more semiconductor laser units, characterized in that, the semiconductor laser unit consists of a laser chip, a substrate bonded to the laser chip for heat dissipation and electrical connection, and an insulation plate soldered to the substrate for insulation and heat dissipation, wherein the semiconductor laser unit is soldered on the heat sink with the insulation plate therebetween.

The semiconductor laser units above have been tested, aged, and screened.

The laser chip above is a single emitter, a short array (e.g. Mini-bar, Half-bar and standard centimeter bar) or multiple single emitter groups.

The material of the substrate above is conductive and has a thermal conductivity higher than 170 W/(m$^2$·K), (for example, metal material such as copper, copper tungsten, molybdenum copper, copper diamond or the like or metal-based composite material).

The thermal conductivity of the above-mentioned insulation plate is higher than 120 W/(m$^2$·K). The insulation plate may be ceramic (e.g. MN, BeO), diamond or the like.

The heat sink above has a heat radiation structure with a manner of water cooling, air cooling or electronic cooling, or a combination of two or more thereof.

The conduction cooled high power semiconductor laser comprises one or more heat sinks.

A method for fabricating the above-mentioned conduction cooled high power semiconductor laser comprises the following steps:

(1) bonding single emitters or short arrays (e.g. Mini-bar, Half-bar and standard centimeter bar) on the substrate which has the function of heat dissipation and electrical connection; soldering the substrate on the insulation plate which has the function of insulation and heat dissipation to form the semiconductor laser unit;

(2) testing, aging, and screening the semiconductor laser units; and (3) soldering a plurality of the screened qualified semiconductor laser units on the heat sink with an insulation plate therebetween to form the conduction cooled high power semiconductor laser.

Another method for fabricating the above-mentioned conduction cooled high power semiconductor laser comprises the following steps:

(1) bonding single emitters or short arrays (e.g. Mini-bar, Half-bar and standard centimeter bar) on the substrate which has the function of heat dissipation and electrical connection; soldering the substrate on the insulation plate which has the function of insulation and heat dissipation to form the semiconductor laser unit;

(2) testing, aging, and screening the semiconductor laser units;

(3) soldering a plurality of the selected qualified semiconductor laser units together, and then soldering the bonded the plurality of semiconductor laser unit to a heat sink with an insulation plate therebetween to form the conduction cooled high power semiconductor laser.

The present invention has the following advantageous effects:

1. Low cost. Each semiconductor laser unit is tested, aged, and screened in advance, and thereby the yield of the fabrication is improved and the cost can be significantly reduced.

2. Excellent heat dissipation. Soldering each semiconductor laser unit to the heat sink ensures a good contact between each semiconductor laser unit and the heat sink. Hence the efficiency of heat dissipation is greatly improved.

3. By screening the qualified semiconductor laser units after individually testing and aging of each semiconductor laser unit and then soldering the screened semiconductor laser units on the heat sink, excellent performance of the fabricated conduction cooled high power semiconductor laser can be guaranteed.

4. High reliability. The semiconductor laser of the invention is suitable to the usage in complex and volatile environments, such as high temperature or the like.

Wherein: 1 refers to the semiconductor laser unit; 2 refers to the heat sink; 3 refers to the laser chip; 4 refers to the substrate; and 5 refers to the insulation plate.

DETAILED DESCRIPTION OF THE PREFERRED EMBODIMENTS

Detailed description of the present invention is given in combination with the figures.

Figure 1:
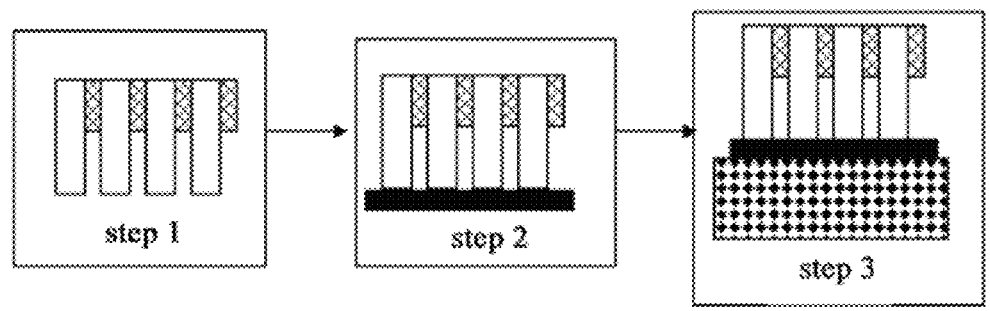
FIG. 1 is a schematic view of a method for fabricating conduction cooled high power semiconductor laser.
Figure 2:
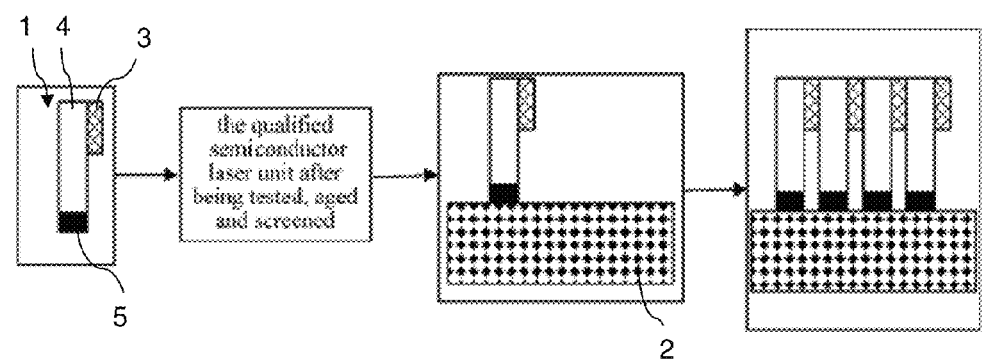
FIG. 2 is a schematic view of the first method for fabricating the conduction cooled high power semiconductor laser according to the present invention.

Referring to FIG. 2, a schematic view of the first method for fabricating the conduction cooled high power semiconductor laser according to the present invention is provided.

(1) bonding single emitters or short arrays on the substrate which has the functions of heat dissipation and electrical connection; soldering the substrate on the insulation plate which has the function of insulation and heat dissipation to form the semiconductor laser unit;

(2) testing, aging, and screening the semiconductor laser units; and (3) soldering a plurality of the screened qualified semiconductor laser units on the heat sink with an insulation plate therebetween to form the conduction cooled high power semiconductor laser.

Figure 3:
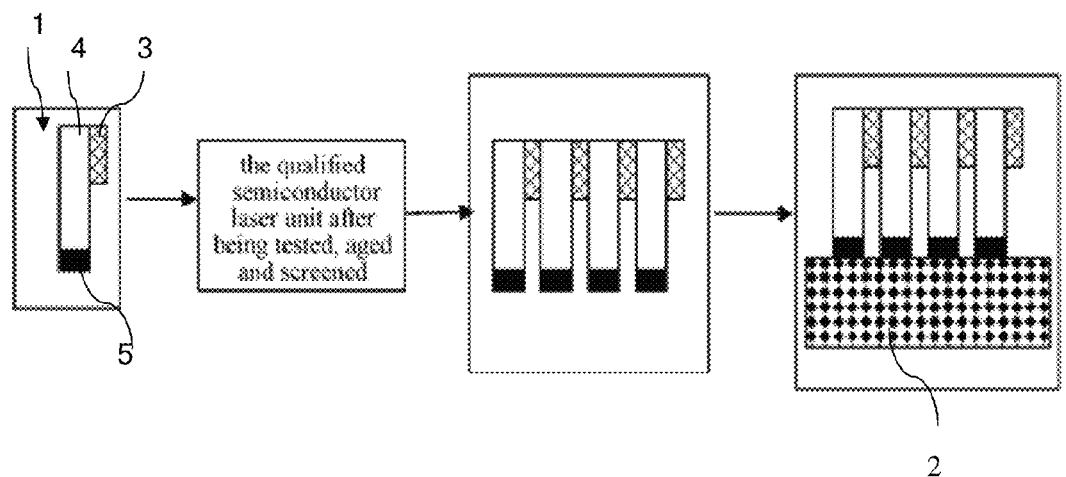
FIG. 3 is a schematic view of the second method for fabricating the conduction cooled high power semiconductor laser according to the present invention.

Referring to FIG. 3, the second method for fabricating the conduction cooled high power semiconductor laser according to the present invention is provided.

(1) bonding single emitters or short arrays on the substrate which has the function of heat dissipation and electrical connection; soldering the substrate on the insulation plate which has the function of insulation and heat dissipation to form the semiconductor laser unit;

(2) testing, aging, and screening the semiconductor laser units; and (3) soldering a plurality of the screened qualified semiconductor laser units together, and then soldering the bonded plurality of semiconductor laser units to a heat sink with an insulation plate therebetween to form the conduction cooled high power semiconductor laser.

Figure 4:
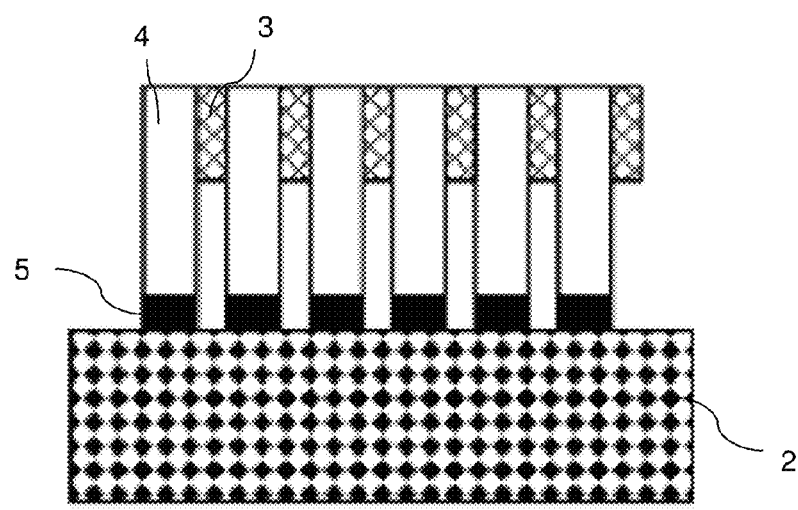
FIG. 4 is a schematic view of the structure of the conduction cooled high power semiconductor laser according to the present invention.

FIG. 4 is a schematic view of the conduction cooled high power semiconductor laser according to the present invention. A conduction cooled high power semiconductor laser comprises semiconductor laser unit 1 and a heat sink 2.

The semiconductor laser unit 1 is soldered on the heat sink 2.

Semiconductor laser unit 1 comprises chip 3, substrate 4 soldered to the chip and having a function of heat dissipation and electrical connection, and an insulation plate 5 soldered to the substrate 4, wherein the semiconductor laser unit 1 is soldered on the heat sink 2 through the insulation plate 5.

The conduction cooled high power semiconductor laser comprises one or more heat sinks.

Semiconductor laser unit 1 is a qualified semiconductor laser unit screened after being tested and aged.

Laser Chip 3 may be a single emitter, a short array, such as Mini-bar and Half-bar, standard centimeter bar, or a plurality of single emitter groups.

The material of substrate 4 is conductive and has a high thermal conductivity. For example, the material can be a metal material, such as copper, copper tungsten, molybdenum copper, copper diamond or the like, or metal-based composite material.

The material of insulation plate 5 is an insulating material and has a high thermal conductivity. For example, the material can be ceramic (e.g. MN, BeO), diamond or the like.

The heat sink 2 may employ high thermal conductivity material for cooling, and may also has a heat radiation structure with a manner of water cooling, air cooling or electronic cooling, or a combination of two or more thereof.

The working principle of the present intention is provided as follows:

The semiconductor laser is driven by an external power supply. The heat generated by the semiconductor laser is conducted to the insulation plate through the substrate, and then to the heat sink.

In the present invention, the chip is bonded to the substrate; and an insulation plate is soldered on the substrate to form the semiconductor laser unit. The semiconductor laser unit is individually aged, tested, and screened. Laser chips of different wavelengths may be screened so as to realize the output with a wide range of multiple wavelengths.

Figure 5:
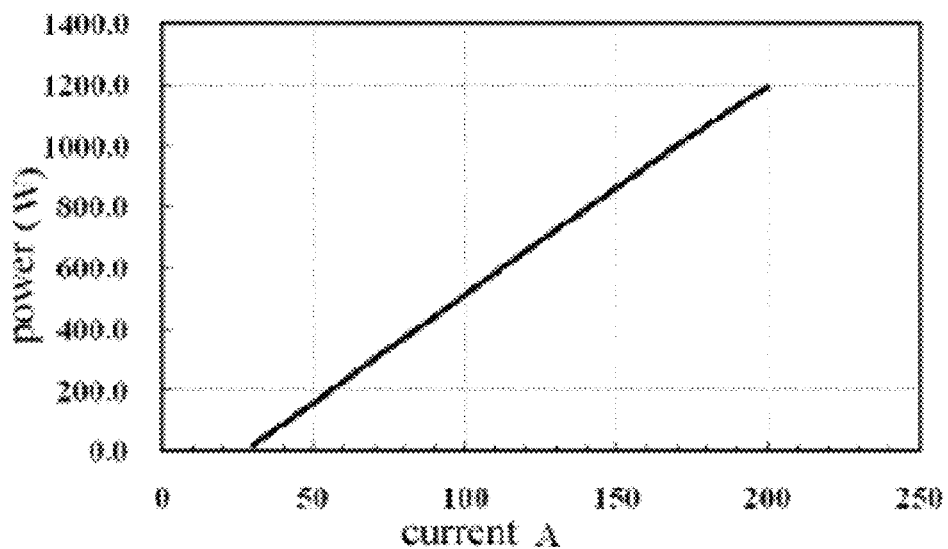
FIG. 5 is a power testing data of the fabricated conduction cooled high power semiconductor laser at 50° C.
Figure 6:
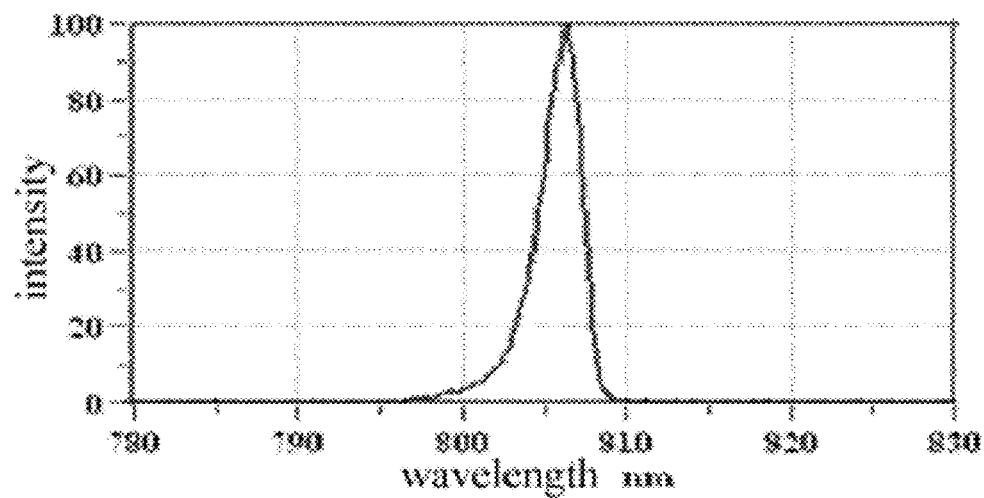
FIG. 6 is a spectrum testing data of the fabricated conduction cooled high power semiconductor laser at 50° C.

According to the method for fabricating conduction cooled high power semiconductor laser of the present application, a conduction cooled high power semiconductor laser is successfully fabricated, the structure of which is shown in FIG. 4. Six laser bars with the output power of 200 W per bar are screened and connected in series. FIG. 5 is a power testing data of the fabricated conduction cooled high power semiconductor laser at 50° C. As can be seen from FIG. 5 that, at 50° C., the output peak power of the present conduction cooled high power semiconductor laser is 1194 W with the conversion efficiency up to 52%. FIG. 6 is a spectrum testing data of the fabricated conduction cooled high power semiconductor laser at 50° C. As can be seen from FIG. 6 that, at 50° C., the full width at half maximum of the present conduction cooled semiconductor laser is as narrow as 2.93 nm. It can be seen that the present conduction cooled high power semiconductor laser has excellent performance in heat dissipation and can be used in high duty cycle and high temperature environment.

What is claimed is:

1. A conduction cooled high power semiconductor laser, comprising:

a heat sink;
a first semiconductor laser unit a second semiconductor laser unit, each of the first and second semiconductor laser units comprising:
a laser chip,
a substrate bonded to the laser chip for heat dissipation and electrical connection, and
an insulation plate soldered to the substrate for insulation and heat dissipation;
wherein the first and second semiconductor laser units are soldered together so that the laser chip of the first semiconductor unit is bonded to the substrate of the second laser chip; and
wherein the first and second semiconductor laser units are soldered on the heat sink with the insulation plate therebetween.

2. The semiconductor laser of claim 1, wherein the first and second semiconductor laser units are tested, aged, and screened before they are soldered together.

3. The semiconductor of claim 1, wherein the laser chip is at least one of the following: a single emitter, a short array mini bar, a standard centimeter bar or a plurality of single emitter groups.

4. The semiconductor laser of claim 1, wherein the material of the substrate is conductive and has a thermal conductivity higher than 170 W/(m2·K).

5. The semiconductor laser of claim 4, wherein the thermal conductivity of the insulation plate is higher than 120 W/(m2·K).

6. The semiconductor laser of claim 1, wherein the heat sink has a heat radiation structure with a manner of water cooling, air cooling or electronic cooling, or a combination of two or more thereof.

7. The semiconductor laser of claim 6, further comprising at least two heat sinks.

8. A method for fabricating a conduction cooled high power semiconductor laser, the method comprising the steps of:
(1) bonding a laser chip on a substrate, wherein the substrate has a function of heat dissipation and electrical connection;
(2) soldering the substrate on an insulation plate, wherein the insulation plate has a function of insulation and heat dissipation to form a semiconductor laser unit;
(3) testing, aging, and screening the semiconductor laser unit; and
(4) soldering a plurality of the screened qualified semiconductor laser units on a heat sink with the insulation plate therebetween to form the conduction cooled high power semiconductor laser.

9. The method for fabricating a conduction cooled high power semiconductor laser, the method comprising the steps of:
(1) bonding a laser chip on a substrate, wherein the substrate has a function of heat dissipation and electrical connection;
(2) soldering the substrate on an insulation plate, wherein the insulation plate has a function of insulation and heat dissipation to form a semiconductor laser unit;
(3) testing, aging, and screening the semiconductor laser unit; and
(4) soldering a plurality of the screened qualified semiconductor laser units together, and then soldering the soldered plurality of semiconductor laser units to a heat sink with the insulation plate therebetween to form the conduction cooled high power semiconductor laser.

* * * * *